United States Patent
Wilson (10) Patent No.: US 8,020,123 B2
(45) Date of Patent: Sep. 13, 2011

(54) TRANSACTION-BASED SYSTEM AND METHOD FOR ABSTRACTION OF HARDWARE DESIGNS

(75) Inventor: James Christopher Wilson, Los Gatos, CA (US)

(73) Assignee: Synopsys, Inc., Mountain View, CA (US)

( * ) Notice: Subject to any disclaimer, the term of this patent is extended or adjusted under 35 U.S.C. 154(b) by 753 days.

(21) Appl. No.: 12/099,723

(22) Filed: Apr. 8, 2008

(65) Prior Publication Data

US 2009/0012771 A1  Jan. 8, 2009

Related U.S. Application Data

(62) Division of application No. 11/244,862, filed on Oct. 4, 2005.

(60) Provisional application No. 60/615,892, filed on Oct. 4, 2004, provisional application No. 60/941,919, filed on Jun. 4, 2007.

(51) Int. Cl.
G06F 17/50 (2006.01)

(52) U.S. Cl. ........ 716/106; 716/105; 716/111; 716/136; 703/16

(58) Field of Classification Search .................. 716/5, 7, 716/18, 105, 106, 111, 136; 703/16
See application file for complete search history.

(56) References Cited

U.S. PATENT DOCUMENTS

| | | | |
|---|---|---|---|
| 5,953,519 A | 9/1999 | Fura | |
| 6,212,667 B1 * | 4/2001 | Geer et al. | 716/136 |
| 6,421,815 B1 | 7/2002 | Seawright | |
| 6,675,138 B1 * | 1/2004 | Hollander et al. | 703/13 |
| 6,810,372 B1 * | 10/2004 | Unnikrishnan et al. | 703/13 |
| 6,859,770 B2 * | 2/2005 | Ramsey | 703/16 |
| 6,917,909 B1 | 7/2005 | Markov et al. | |
| 6,964,026 B2 * | 11/2005 | Moore et al. | 716/102 |
| 7,007,251 B2 * | 2/2006 | Hekmatpour | 716/106 |
| 7,555,689 B2 * | 6/2009 | Goswami et al. | 714/741 |
| 7,921,389 B2 * | 4/2011 | Roesner et al. | 716/104 |
| 2002/0156608 A1 * | 10/2002 | Armbruster et al. | 703/14 |
| 2004/0054500 A1 | 3/2004 | Beverly et al. | |
| 2005/0010880 A1 | 1/2005 | Schubert et al. | |
| 2005/0198606 A1 | 9/2005 | Gupta et al. | |
| 2006/0026548 A1 * | 2/2006 | Roesner et al. | 716/18 |
| 2009/0307637 A1 * | 12/2009 | Lichtensteiger et al. | 716/4 |
| 2009/0327986 A1 * | 12/2009 | Goswami et al. | 716/6 |

* cited by examiner

*Primary Examiner* — Phallaka Kik
(74) *Attorney, Agent, or Firm* — Bever, Hoffman & Harms, LLP; Jeanette S. Harms (57) ABSTRACT

Apparatus and method for transaction-based abstraction process can, in an embodiment, include three main phases: first, selecting a set of transaction-processing finite state machines (FSMs) that determine transaction boundaries. Second, extracting the transaction-processing FSMs, composing them, and computing an abstracted FSM corresponding to the composed FSM after abstraction, step 115. Third, abstracting all signals in the design based on the computed abstract FSM.

13 Claims, 10 Drawing Sheets

Automatic Test Plan Generation Flow

Figure 1
Transaction-based Abstraction Process

Figure 2
Transaction-Processing FSM Example

Figure 3
FSM Abstraction Process

Figure 4
Interacting Transaction-
Processing FSMs

| FSM A | label |
|---|---|
| a0 | x |
| a1 | x |
| a2 | a2 |

| FSM B | label |
|---|---|
| b0 | b0 |
| b1 | y |
| b2 | y |
| b3 | y |

| Composite FSM | label |
|---|---|
| {a0,b0} | {x,b0} |
| {a1,b1} | c1 |
| {a2,b2} | {a2,y} |
| {a2,b3} | {a2,y} |

Figure 5
Composite State Labeling

Figure 6
Abstracted Composite FSM
Example

Figure 7
Signal Abstraction Process

Figure 8
Word Terminal Abstraction Procedure

Unabstracted:
$$s(t) = (fsm(t-1) == s(0)\ ?\ 0 : s(t) + 1$$

Pass 1:

$$s0 : s(t') = 0$$
$$s1 : s(t') = s(s0) + 1$$
$$s2 : s(t') = s(s1) + 1$$
$$s3 : s(t') = g'\ ?\ s(s2) + 1 : s(s2)$$

Pass 2:

$$a0(s0) : s(t') = 0$$
$$a0(s1) : s(t') = 0 + 1 = 1$$
$$a0(s2) : s(t') = 1 + 1 = 2$$
$$a0(s3) : s(t') = g'\ ?\ 2 + 1 : 2 = g\ ?\ 2 : 1$$

Pass 2:

Abstracted:
$$s(t') = g'\ ?\ 2 : 1$$

Figure 9
Signal Abstraction Example

Figure 10
Automatic Test Plan Generation Flow

TRANSACTION-BASED SYSTEM AND METHOD FOR ABSTRACTION OF HARDWARE DESIGNS

CROSS-REFERENCE TO RELATED APPLICATIONS

This application is a divisional of and claims the benefit of priority from Utility Patent Application Ser. No. 11/244,862, filed Oct. 4, 2005 and entitled "Transaction-Based System and Method for Abstraction of Hardware Designs", as well as Provisional Patent Application Ser. No. 60/615,892 filed 10/04/04, having the same title, both of which are fully incorporated herein by reference. This application also claims the benefit of Provisional Patent Application Ser. No. 60/941,919, having the same title as the present application and incorporated herein by reference in its entirety.

BACKGROUND OF THE INVENTION

1. Field of the Invention

This invention relates generally to systems and methods for simulation and verification of electronic hardware designs. More particularly, this invention relates to systems and methods for performing abstraction to permit more efficient simulation, and more specifically relates to systems, methods and techniques for temporal abstraction in which hardware operation is redefined in terms of transactions.

2. Description of the Art

Abstraction is, in simplified terms, a technique for masking irrelevant detail so that the key elements of a concept or other construct may be more clearly appreciated. In the context of verification of electronic hardware designs using simulation, abstraction is useful because it reduces the amount of work required to perform the simulation, thereby allowing more simulation to be done in a given amount of time. Simulation differs from abstraction because simulation is a repeated activity. In contrast, abstraction only needs to be done once. As a result, abstraction, whether automatic or manual, provides substantial benefit. Abstractions can be classified into four basic types: structural, behavioral, data, and temporal. Structural abstraction removes unneeded structure, for example, gates or registers in the case of hardware design. Behavioral abstraction removes functionality. Data abstraction reduces the range of data values possible. Temporal abstraction removes unneeded time steps during the simulation.

SUMMARY OF THE INVENTION

The present invention provides a novel form of transaction-based abstraction. Transaction-based abstraction is a form of temporal abstraction. In the present invention, hardware is assumed to process transactions, which is defined to mean that the hardware accepts a request, processes the request, and returns a response, and that the hardware can process such requests infinitely often. A simulation of the unabstracted design causes each transaction to start at a first time step and end one or more time steps later. In accordance with the present invention, the design is abstracted such that, a simulation of the device causes every transaction to occur in exactly one abstracted time step.

To achieve the desired effectiveness of transaction-based abstraction, the boundaries of a transaction, that is, the starting and ending time steps of each transaction, must be correctly determined. In accordance with the present invention, a heuristic technique is used to identify finite-state machines (FSMs) in the design that process transactions, from which the transaction boundaries can be identified. Heuristics filter signals that determine transaction boundaries. Possible heuristics include:

- select signals that look like FSMs that may process transactions;
- select signals representing FSMs that have wait states indicating the FSM waits for either a request or response;
- select signals representing FSMs that have state transition loops indicating that the FSM can process transactions infinitely often; and
- allow the user to manually specify signals and conditions that determine transaction boundaries.

In an implementation where the transaction boundaries are specified, for example, the user inserts a statement in the hardware description that defines the beginning of the transaction. The end of the transaction can be specified either explicitly by inserting an "end of transaction" statement, or implicitly by inserting another "begin transaction" statement at the beginning of the next transaction. In some instances, it is desirable to modify the hardware description language to include support for statements that demarcate transaction boundaries. Alternatively, in at least some embodiments, statements defining the transaction boundaries are inserted automatically.

Signals may also require abstraction as a result of the transaction-based abstraction of the present invention. For example, if a circuit processing transactions requires four cycles, it may have four pipeline stages, each stage being defined by a different signal. After abstraction, these four pipeline stages will be compressed to one stage. Therefore, the signal definitions for each stage need to be modified to account for this difference.

In accordance with the present invention, signals can be classified based on the abstracted design. Signals can be classified as either transient, temporary, or persistent. Transient signals are those that implement the transaction-processing FSMs that define the transaction boundaries. Persistent state-holding elements (e.g., registers, RAMs, etc.) are those signals whose values are set in one transaction and accessed in another. Temporary signals are all other signals.

In accordance with the present invention, transaction-based abstraction enables signals to be classified easily according to the above criteria. Transient signals are identified during the abstraction process as the transaction-processing FSMs that define the transaction boundaries. In the unabstracted design, all combinational signals are temporary since they are set and used in the same time step and all transactions are at least one time step in length. State-holding signals may also be classified as temporary if, after abstraction, they become combinational in the abstracted design. All signals that remain as state-holding signals after abstraction are persistent.

An additional feature of the present invention is that it allows a comprehensive test plan to be automatically generated for a device. This is beneficial because it relieves the user from performing this task manually. A test plan comprises a set of conditions called coverage points that are derived based on a signal classification created using transaction-based analysis to identify the architecturally-visible state of the design.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

The present invention will now be described in detail with reference to the drawings, which are provided as illustrative examples of the invention so as to enable those skilled in the art to practice the invention. The figures and examples below are not meant to limit the scope of the invention.

In a general sense, transaction-based abstraction is a form of temporal abstraction. In the present invention, hardware is assumed to process transactions, which is defined to mean that the hardware accepts a request, processes the request, and returns a response, and that the hardware can process such requests infinitely often. A simulation of the unabstracted design causes each transaction to start at a first time step and end one or more time steps later. In accordance with the present invention, the design is abstracted such that, a simulation of the device causes every transaction to occur in exactly one abstracted time step.

Figure 1:
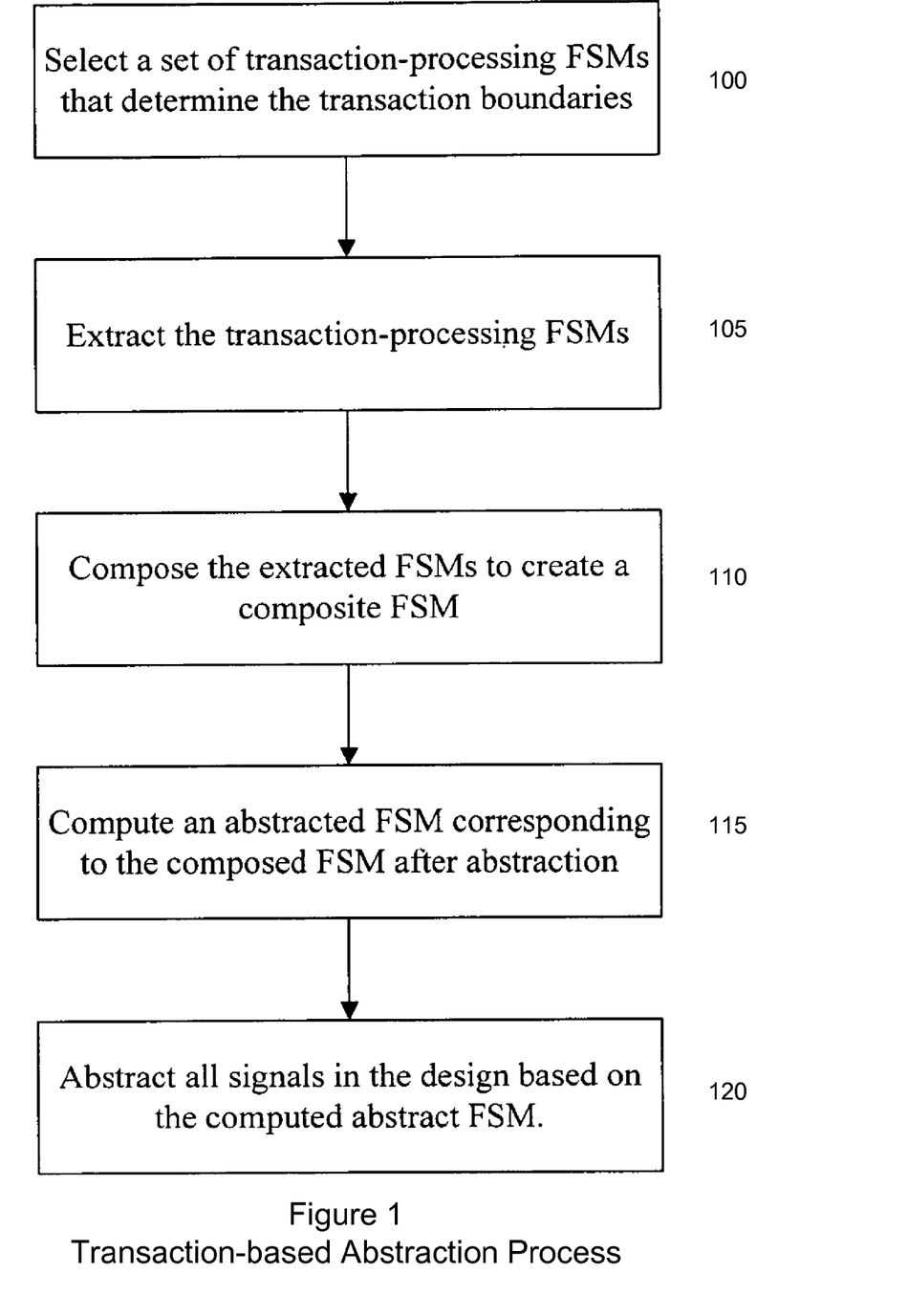
FIG. 1 illustrates an overall transaction-based abstraction process according to certain embodiments of the invention.

FIG. 1 illustrates an overall transaction-based abstraction process according to certain embodiments of the invention, which can include three main phases.

Select a set of transaction-processing finite state machines (FSMs) that determine the transaction boundaries, shown at step 100.

Extract the transaction-processing FSMs, step 105, compose them, step 110, and compute an abstracted FSM corresponding to the composed FSM after abstraction, step 115.

Abstract all signals in the design based on the computed abstract FSM, step 120

Each of these three phases will is discussed in further detail below.

Selecting A Set of Transaction-Processing FSMs

To achieve the desired effectiveness of transaction-based abstraction, the boundaries of a transaction, that is, the starting and ending time steps of each transaction, must be correctly determined. In accordance with the present invention, and as shown in FIG. 1 at step 100, a heuristic technique can be used to identify finite-state machines (FSMs) in the design that process transactions, from which the transaction boundaries can be identified. Heuristics can filter signals that can be used to determine transaction boundaries. Possible heuristics include:

select signals that look like FSMs that may process transactions;

select signals representing FSMs that have wait states indicating the FSM waits for either a request or response;

select signals representing FSMs that have state transition loops indicating that the FSM can process transactions infinitely often; and allow the user to manually specify signals and conditions that determine transaction boundaries.

In certain embodiments of the present invention, the steps for identifying a set of signals representing transaction-processing FSMs include:

Identify the subset of signals that can be used to determine FSMs.

Eliminate from this list those FSMs that do not process transactions. Transaction-processing FSMs can have the following characteristics:

They have at least one wait state, where a wait state is a state that transitions to itself based on some condition.

There is at least one loop in the FSM, where a loop is a path in the FSM state graph that starts in some state and ends at the same state.

One of the states contained within the loop path is a wait state.

The resulting set of FSMs is the transaction-processing FSM set.

Figure 2:
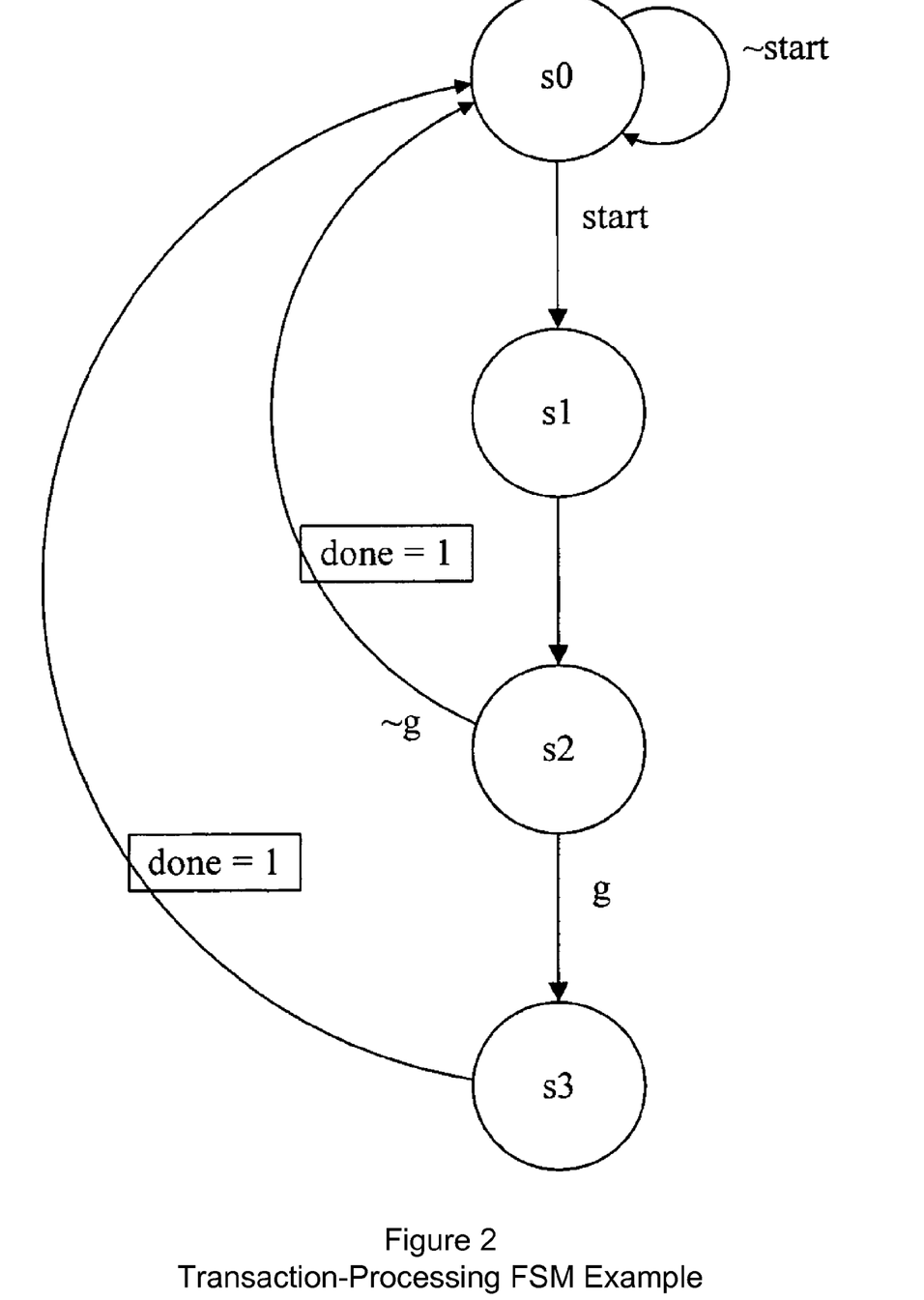
FIG. 2 illustrates, in state diagram form, an exemplary finite state machine ("FSM") which represents a device that processes transactions according to certain embodiments of the invention.

FIG. 2 illustrates, in state diagram form, an exemplary finite state machine ("FSM") which represents a device that processes transactions according to certain embodiments of the invention As shown in FIG. 2, the exemplary FSM consists of four states, s0, s1, s2, and s3. According to the present invention, a transition consists of a current state, u, next state, v, and guard, g. If the FSM is in state u at time t and condition g is true, it will transition to state v in the next time step. Transitions are indicated as edges in the state transition graph with edge labels indicating the guard condition g. Unlabelled edges represent unconditional transitions. Assignments indicated by a box attached to an edge in a graph indicate signals that are set as a function of the FSM. State s0 is a wait state because it has an edge to itself labeled "~start", indicating that the FSM should wait in that state until a start signal occurs. Once started, the FSM proceeds through the other states and then loops back to the wait state, at which time it indicates completion of the transaction by asserting the "done" signal. The transaction boundaries occur when the FSM transitions out of the wait state at the beginning and back to the wait state at the end.

Computing the Abstract FSM

After selecting and extracting the transaction-processing FSMs from the design, as shown at step 105 in FIG. 1, the extracted FSMs are combined to form a composite FSM, step 110. Composition of FSMs is done by enumerating all combinations of states and edges in the individual extracted FSMs. Composite edges are formed by computing the product of all edge transition conditions for individual FSMs. Since FSM inputs may be functions of one or more other FSMs being composed, this may cause some edges or states to be unreachable if the computed product condition is false.

Figure 3:
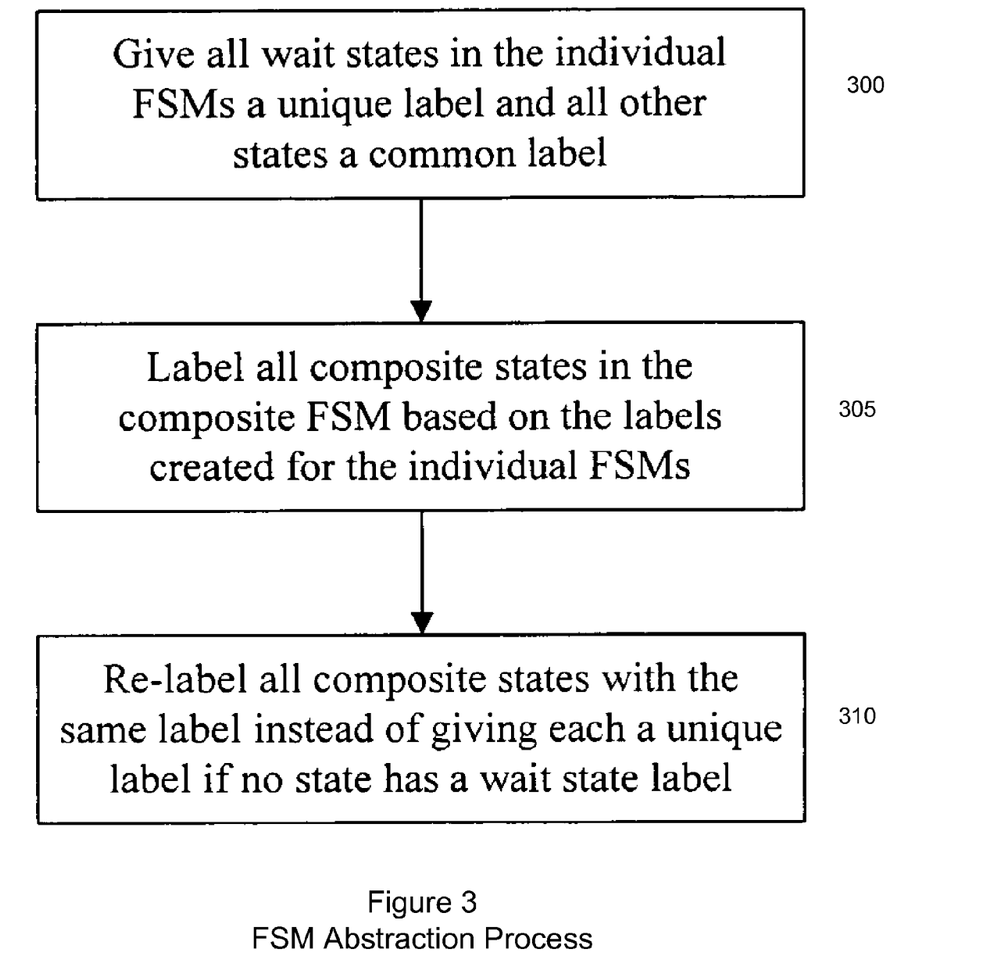
FIG. 3 illustrates an FSM abstraction process according to certain embodiments of the invention.

In accordance with an embodiment of the present invention, an abstract FSM is computed in which states in the abstract FSM correspond to sets of states in the composite FSMs, as shown at Step 115 of FIG. 1. FIG. 3 illustrates this FSM abstraction process according to certain embodiments of the invention. As shown in the first step of FIG. 3, labeled 300, all wait states in the individual FSMs are given a unique label and all other states are given a common label.

Next, all composite states in the composite FSM are labeled based on the labels created for the individual FSMs, shown at 305. The goal of labeling the composite states in this second step of FIG. 3 is to delineate states that have different wait conditions since different wait conditions may indicate different transactions. One way to accomplish this to label states in the composite FSM with the combination of individual FSM labels corresponding to the component of the composite state. If a composite state has no component that is labeled as a wait state, give this composite state a unique label.

After all composite states have been labeled, then, if all composite states have no component that is labeled a wait state, re-label all composite states with the same label instead of giving each a unique label (since there is no wait state), labeled 310. In this way, a single pass through the FSM indicates a single transaction. In this example, all states would be given the same label.

The set of abstract states corresponds to the unique labels produced using the above procedure for the composite FSM. An edge exists between two abstract states if there exists an edge between two corresponding states in the composite FSM. The transition condition for this edge is the OR of all composite transition conditions for this abstract edge.

Figure 4:
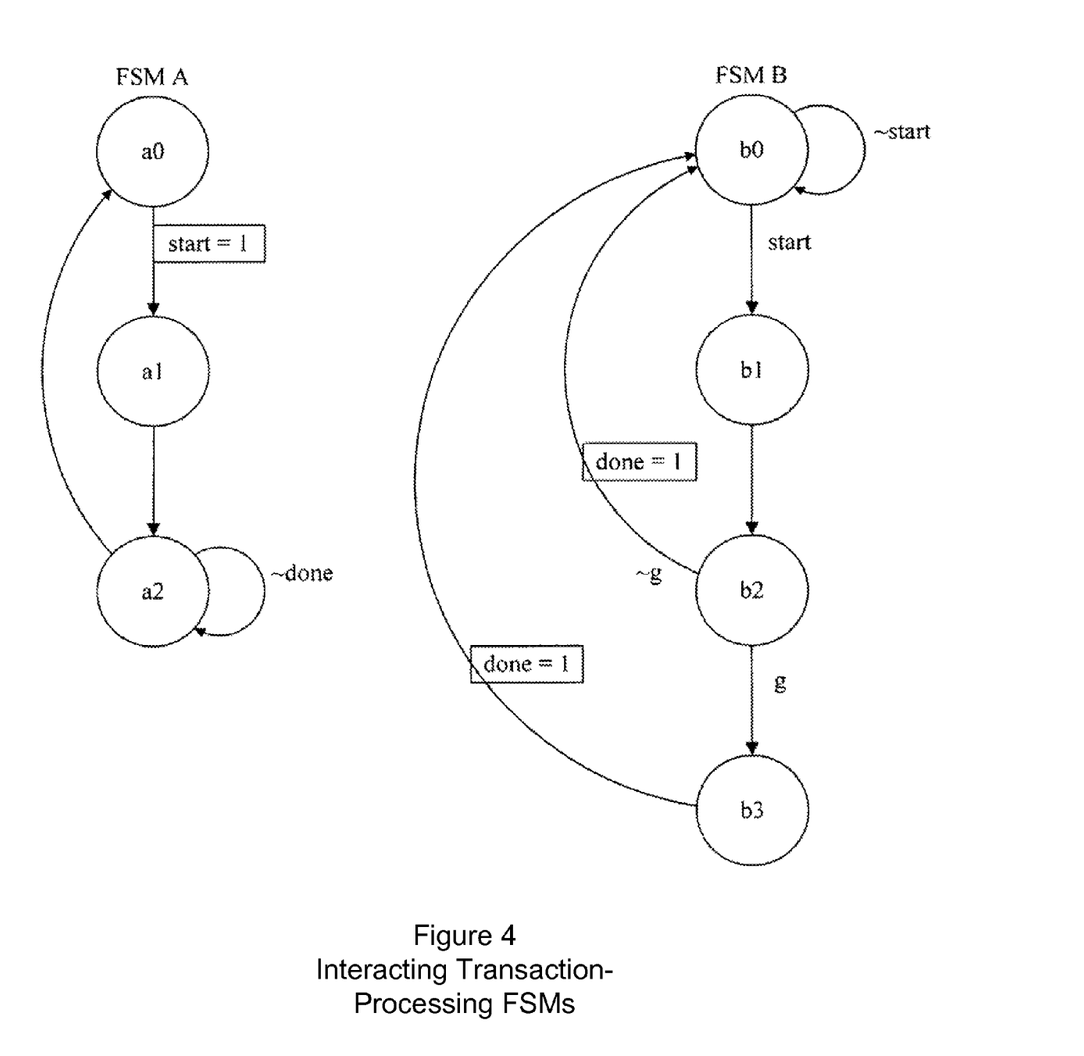
FIG. 4 illustrates, in state diagram form, two exemplary interrelated FSM's which interact, representing two devices which similarly interact in processing transactions, according to certain embodiments of the invention.

As an example, FIG. 4 illustrates, in state diagram form, two exemplary interrelated FSM's which interact, representing two devices which similarly interact in processing transactions, according to certain embodiments of the invention. In this example, FSM A drives transactions to FSM B, which waits for a transaction start, processes the transaction, and then signals done. FSM A waits for the done indication before starting the next transaction. In FSM A, state transition a0 to a1 causes signal "start" to be set to 1. When FSM B is in state b0, it transitions to b0 if signal "start" is 0, indicated by the edge guard "~start", otherwise, when "start" is 1, it transitions to state b1. Since "start" is set to 1 in FSM A state a0, the only valid composite transition from composite state {a0,b0} is to composite state {a1,b1 }. Similarly, FSM B controls signal "done", setting it to 1 as indicated by the assignment attached to transitions b2→b0 and b3→b0 ("done" is assumed to be set to 0 for all other transitions). The wait state of FSM A, a2, is dependent on the "done" signal produced by FSM B and either waits when "done" is 0, indicated by the edge labeled "~done", or continues to state a0 when "done" is 1.

Figure 5:
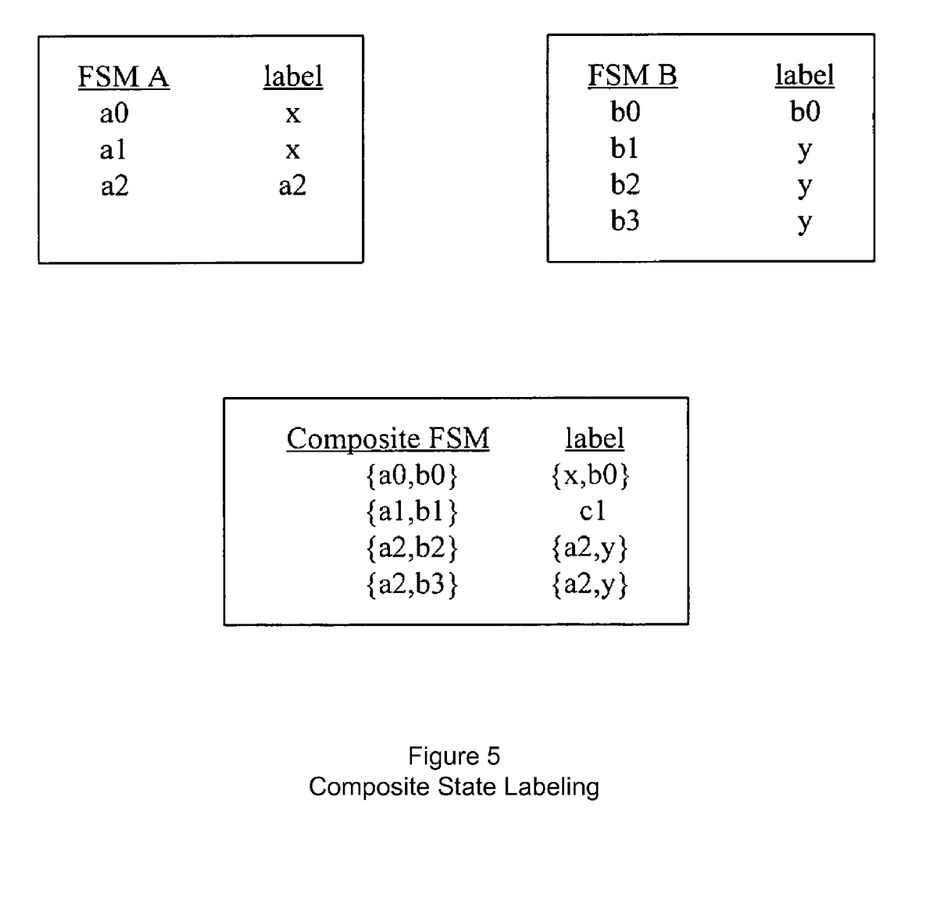
FIG. 5 illustrates, in table form, state labels for the two exemplary FSM's shown in FIG. 4, together with state labels for the composite FSM, according to certain embodiments of the invention.
Figure 6:
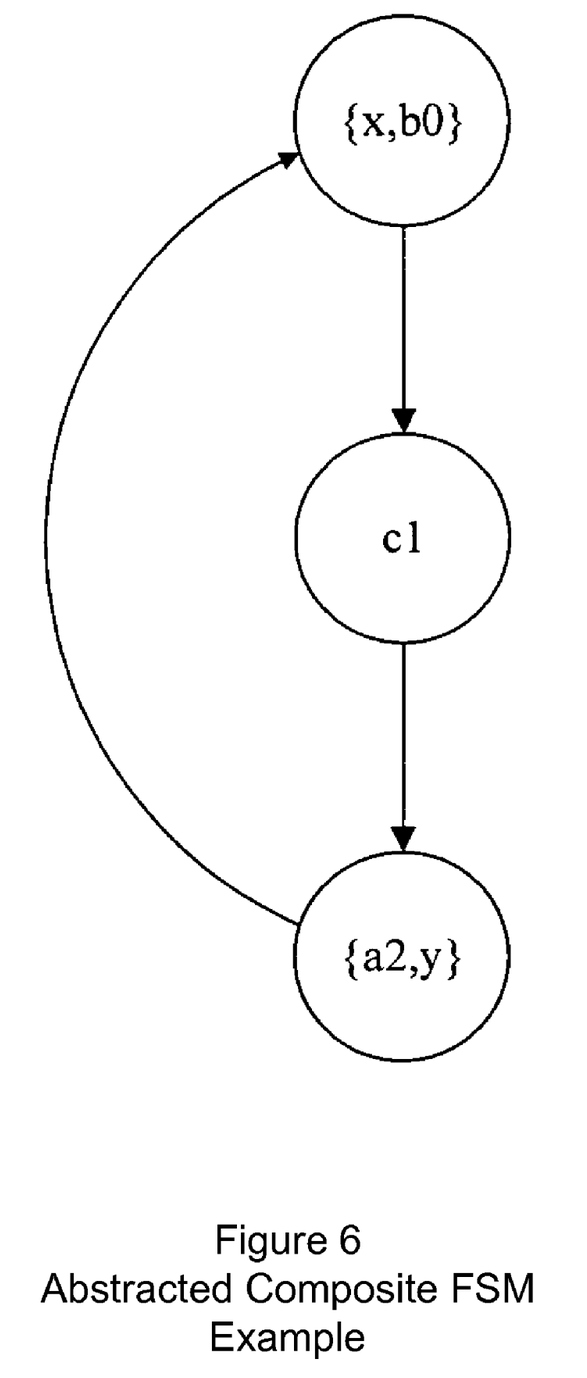
FIG. 6 illustrates, in state diagram form, an abstracted FSM from the two FSM's of FIG. 4 according to certain embodiments of the invention.

FIG. 5 illustrates, in table form, state labels for the two exemplary FSM's shown in FIG. 4, together with state labels for the composite FSM, according to certain embodiments of the invention. Note that composite states {a2,b2} and {a2,b3} have the same composite label. In the abstract, or composite, FSM, these two composite states will be a single abstract state as shown in the abstract FSM in FIG. 6 computed from the two FSMs in FIG. 5. FIG. 6 illustrates, in state diagram form, an abstracted FSM from the two FSM's of FIG. 4 according to certain embodiments of the invention.

When a FSM or composite FSM has a loop but no wait states, abstraction is still possible by simply selecting some state arbitrarily as the transaction boundary state. One way to do this is to select the initial state as the boundary state if the loop is through the initial state, otherwise a boundary state can be selected by traversing the FSM state graph from the initial state and selecting the first loop state encountered to be the boundary state. Since no state is a wait state, instead of each composite state getting a unique label, all states are given the same label. The loop will be abstracted to a single state since states with common labels are combined together during abstraction. The result of this is that abstracted transactions will be one time step in duration since a single abstracted state corresponds to a complete transaction.

Abstracting Signals

A signal definition function specifies the value of a signal over time as a function of other signals and time. For example, the definition of signal "a" may be "$a(t)=b(t)+c(t-1)$" which says that at time t, the value of "a" is given by adding the value of signal "b" at time t to the value of signal "c" at time t−1. The goal of signal abstraction, in accordance with the present invention, is to modify the signal definition such that it is a function of abstract time, t'.

Since time steps are abstracted away, it is possible that signals are functions of time steps that do not exist after abstraction. In this case it is necessary to abstract the signal such that it is a function only of time steps that correspond to abstracted time steps. For example, assume that a simulation of a device contains the signal assignment, "$a(t)=b(t)+c(t-1)$", and that the first transaction starts at time 0 and ends at time 15, which corresponds to abstract time 0. In accordance with the present invention, the signal value for signal "a" at abstract time 0 is defined as "$a(15)=b(15)+c(14)$", which can be abstracted by substituting the appropriate abstract time, 0, for 15 in the expression.

However, there is no abstract time step in the defined signal example above that corresponds to time step 14, thus, this signal cannot be abstracted as is. To solve this problem, signals are composed such that they are functions of time steps that have corresponding abstract time steps. In this context, composition refers to the substitution of a function defining a signal for a signal reference in an expression. For example, suppose that signal "c" is defined as "$c(t)=c(t-1)+1$". Composing the definition of signal "c" into the expression for signal "a" is done in two steps. First, the expression for signal "a" refers to "$c(t-1)$" indicating that this is the value of signal "c" at time t−1. However, the definition for "c" is at time t. Therefore, t−1 must be substituted for t in the expression for "c" to yield the definition "$c(t-1)=c(t-2)+1$". Substituting this into the expression for "a" yields "$a(t)=b(t)+c(t-2)+1$". Composing signal "c" 15 times using this procedure in the expression for "a" produces "$a(t)=b(t)+c(t-16)+15$", which now can be abstracted as "$a(t')=b(t')+c(t'-1)+15$". The term "$c(t'-1)$" arises because, for the first transaction, the transaction length is 16 and therefore, the unabstracted term, "$c(t-16)$" refers to the value in the previous transaction.

It will also be appreciated that different transactions may have different abstractions for the same signal. In the example above, if the second transaction is only five cycles long, for example, the composition of "c" need only be done five times, yielding the abstracted expression "$a(t')=b(t')+c(t'-1)+5$. Different length transactions are indicated by different labels in the composite FSM. Therefore, an abstracted signal definition is needed for each unique label. These different signal definitions are then combined by selecting the correct one as a function of the computed abstract state corresponding to the labeled composite state. During simulation, as the abstract FSM transitions to different states, this enables the different abstract functions for each signal such that each signal is computed correctly for each abstract FSM state. The complete process for performing signal abstraction is described below. This process ensures that the computed signal values for each abstract time step will correspond to the values at the equivalent normal time steps.

Figure 7:
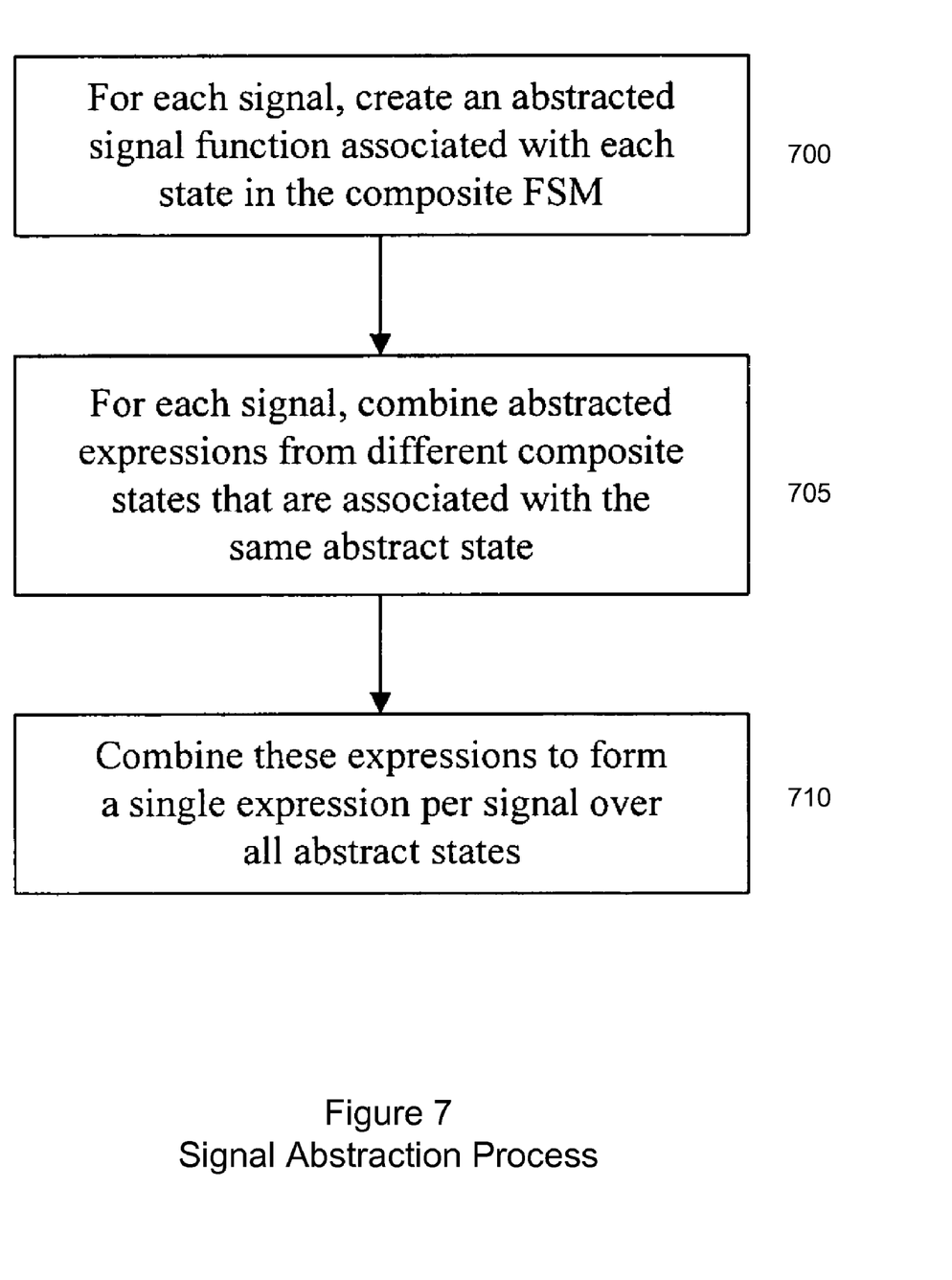
FIG. 7 illustrates a signal abstraction process according to certain embodiments of the invention.

In summary, the signal abstraction algorithm is as shown in FIG. 7. FIG. 7 illustrates a signal abstraction process according to certain embodiments of the invention. The first step of FIG. 7, indicated at 700, is done by performing a breadth-first search ("BFS") of the composite state graph. Each step of this traversal specifies a tuple (u, g, v) where u is the current state, v is the next state, and g is a condition that must be true for the state transition to occur. Values u and v correspond to assignments to the signals that make up the individual signals of the composite state. The expression g contains references to composite state signals and other signals.

Signal values are represented by expressions comprising operators such as add, and, etc., ite operators, constant terminals, and word terminals. The ite operator specifies three subexpressions, an if condition, then assignment, and else assignment and represents an if-then-else (ite) assignment. Word terminals specify the name of a signal and a delay. Since signal values are functions of time, a word terminal with delay k specifies the value of the signal at time t-k. In at least some embodiments, the present invention only considers cases in which the word terminal delay is 0 or 1. Operator nodes have the usual semantics.

In the exemplary implementation described herein, BFS-based abstraction depends on whether the current edge (u, g, v) is a transaction boundary or not. For each pair of states, u, v, that defines a transition, there is a mapping from these states to abstract states in the abstract FSM. Let these abstract states be a_u and a_v. A transaction boundary is defined if a_u!=a_v or if this edge is looping back from the last state to first state of the composite FSM. The abstract boundary state is defined to be state a_v of a transaction boundary as defined above. For example, in FIG. 2, the edge from s3 to s0 would be considered a transaction boundary even if s3 and s0 mapped to the same abstract state, and, therefore, state s0 is defined to be the abstract boundary state.

Figure 8:
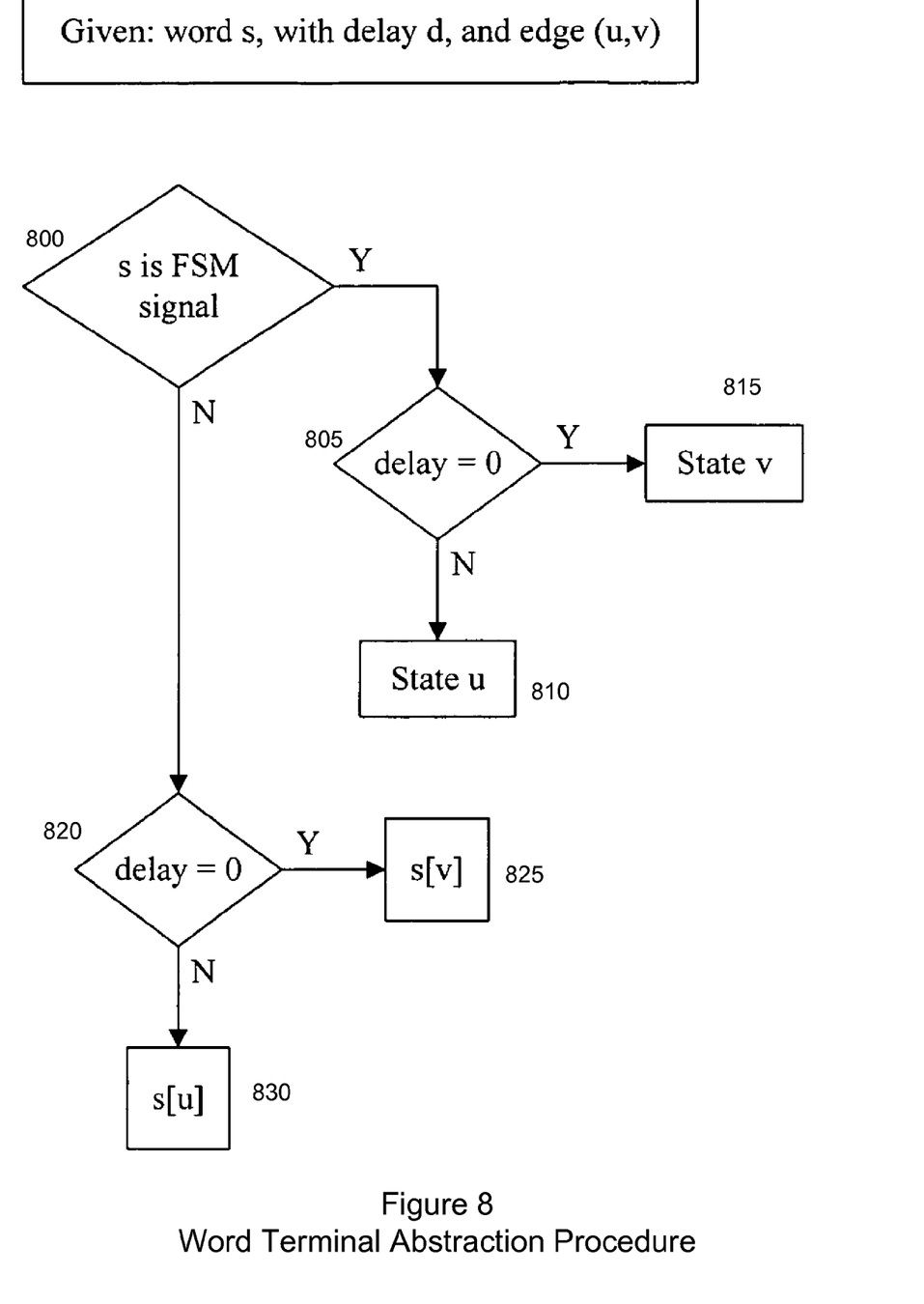
FIG. 8 illustrates a process for computing an abstracted word terminal for a given signal, delay, and composite FSM edge (u, v) according to certain embodiments of the invention.

The signal function definition is parsed and modified only if a word terminal specifying signal s and a delay d are encountered for edge (u, v). The process for determining the abstracted word terminal according to certain embodiments is shown in FIG. 8. FIG. 8 illustrates a process for computing an abstracted word terminal for a given signal, a delay, and a composite FSM edge (u, v) according to certain embodiments of the invention, where a check is made at 800 to determine whether signal s is a FSM signal. If yes, a check is made at step 805 to determine the state of the delay, and the result is either State u, labeled 810, or State v, labeled 815. If the signal s is not a FSM signal, a check is made at step 820 to determine the delay state, and again the result is either s[v], labeled 825, or s[u], labeled 830.

The composite FSM may have states with multiple incoming edges. Since the result of the above process produces an expression for each signal for each state, multiple expressions will be produced for states that have multiple incoming edges and will need to be combined. Typically, multiple incoming edges occur due to multiple outgoing edges somewhere else in the state graph. Multiple outgoing edges are differentiated by different edge guard conditions. A guard condition is just another expression that is a function of time. These guards also need to be abstracted as a function of the composite state using the exact same parsing and modification as described above. Further, guard expressions are propagated along states and edges. For example, if (u, g, v) is an edge with g' being the abstracted expression for g, and edge (v, h, w) is also an edge, then g' will be propagated to edge (v, h, w) because of the common state v. The effective guard for edge (v, h, w) is the expression "g' & h'" where h' is the abstracted value of h which is anded with the previously abstracted value g'.

If a word terminal is marked for composition, this composition will occur the second step of FIG. 7, shown at 705. This second step iterates over all composite states and signals. Each abstracted signal value for each composite state is processed in this pass. For signal s and composite state u, the signal will be processed and stored in an array indexed by the signal and abstract state, u', corresponding to state u. Since multiple composite states may map to a single abstract state, this pass is typically performed in composite state order. That is, state u is typically processed before state v if (u, g, v) is an edge in the composite FSM and (u, g, v) is not a transaction boundary.

This step modifies the expression produced in the previous step before storing it in the array. The modifications also only affect word terminals marked for composition in the previous pass. A marked word terminal specifies a signal p and state w. There are two possible modifications:

If state w is not an abstract boundary state, the word terminal is composed by replacing the word terminal with the abstracted value of signal p associated with state w that was computed in the previous step. The resulting expression is recursively traversed so that multiple compositions may occur.

If state w is an abstract boundary state, the word terminal is replaced with a word terminal specifying word p with delay t'−1 (delay of 1 relative to the abstract clock).

The resulting array of signal values for each abstract state has expressions that are functions of signals at abstract boundaries only. The last step of FIG. 7, labeled 710, combines these into a single assignment for each signal. Given a signal s with values stored in the array for abstract states a_u and a_v, these can be combined by performing an if-then-else in which the if condition is the abstract state being equal to state a_u for example. The resulting expression will consist of a series of ite expressions, such as:

$$s(t')=\text{ite}(a\_fsm=s0, \text{array}[s][s0], \text{ite}(a\_fsm=s1, \text{array}[s][s1], \ldots$$

Figure 9:
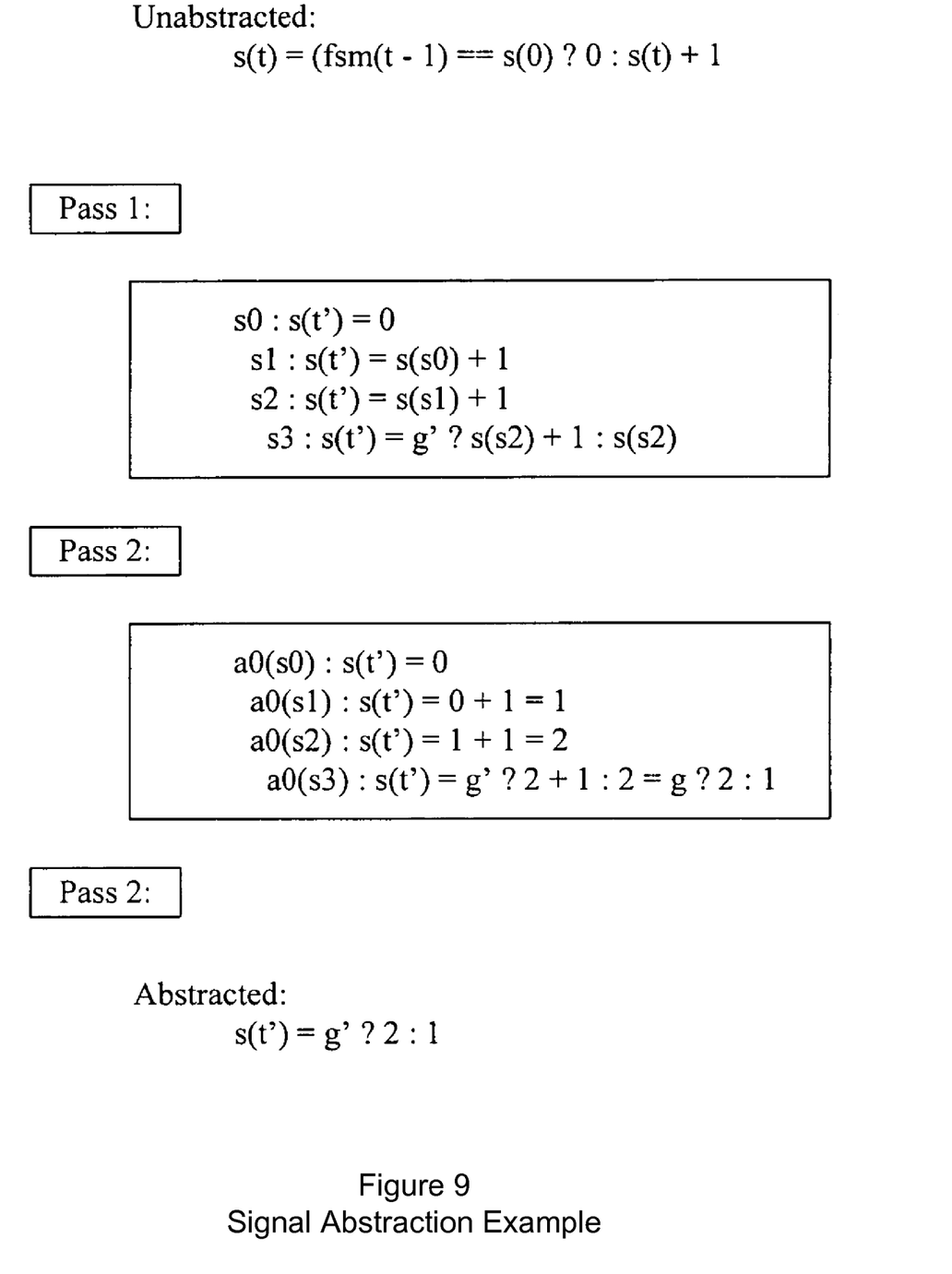
FIG. 9 illustrates an example of signal abstraction for the FSM of FIG. 2, showing the three phases of the abstraction process with signal abstractions labeled with the appropriate state from the FSM shown in FIG. 2, according to certain embodiments of the invention.

As an example of signal abstraction, FIG. 9 illustrates an example of signal abstraction for the FSM of FIG. 2, showing the three phases of the abstraction process with signal abstractions labeled with the appropriate state from the FSM shown in FIG. 2, according to certain embodiments of the invention. Assume the composite FSM is the FSM given in FIG. 2 and a signal, s, is defined as specified at the top of FIG. 9. In the first pass, signal s is abstracted for each edge in the composite FSM. The resulting expressions are stored for each state s0-s3 of the FSM. In the first pass, the value of the signal is abstracted by substituting the state value in the expression in s and marking signal s by specifying a composite state. The abstracted expression for signal s for each state s0, s1, s2, s3, is shown in FIG. 9 in the box labeled "pass 1". Each word terminal is of the form "s(sx)", where "s" is the signal name and "sx" indicates a state (s0, s1, s2, s3), and is marked for composition in the next step. In this example, s is reset to 0 if the FSM is in state s0 and, otherwise, increments. Thus, the abstract value for state s0 is 0. For each of the other states, the expression references s(t−1), which results in the word terminal being marked with the appropriate state. Note that signal g, which exists in the FSM also needs to be abstracted. For clarity, the abstracted value is simply represented as g', however, it also would go through this process.

In the second pass, the signal for each state is modified by substituting the appropriate expression for each marked word. These substitutions are done in state order, s0-s1-s2-s3 and after substitution, the result is stored in the corresponding abstract state array entry. These expressions are shown in the text box marked "pass 2". Each expression is the result of composition and all states are labeled with abstract state a0 with the corresponding composite state in parentheses. Since there is only a single abstract state, the final value is just the value of the array for s in state a0. Since the expression for s3 was created last, this is the final value of the abstracted value of signal s.

In this example, the unabstracted version of signal s is a function of itself, which means that it is a state-holding element. Furthermore, it is a function of another state-holding element, the FSM. With no other context for this signal, it has a fairly complex definition. After abstraction, signal s is no longer a function of itself or the FSM and is not a state-holding element. We know that the abstraction represents the function of this signal for one transaction. After abstraction, it is much more obvious what the meaning of this signal is. Also, because the definition is simpler, it can be more efficiently simulated. The ability to make signal functions easier to understand and to simplify them illustrate one of the many advantages of transaction-based abstraction.

Signal Classification

It is useful during verification of hardware to classify signals into different types that have different verification goals. In particular, sequential logic requires different verification techniques than combinational logic. Normally, the user must perform this classification manually. In large circuits, this is a tedious task.

As discussed previously herein, one aspect of the present invention is that signals are classified according to their use in processing transactions. There are three types of signals:
Transient
Temporary
Persistent Transient signals consist of the transaction-processing finite-state machines (FSMs) that control the transaction by detecting when a transaction starts, controlling the processing of the transaction, and then signaling its completion.

Temporary signals are those that are used only within a single transaction. A signal that is used only within a transaction must be set before being read within the transaction. Because it is set before being used within a transaction, the value of a temporary signal in one transaction cannot affect the operation of other transactions.

Persistent signals are those that are set in one transaction and read in another.

In accordance with the present invention, signals are classified by performing transaction-based analysis of the design. Each of the signal types is determined by the abstraction process as follows:
Transient signals are the signals corresponding to the transaction-processing FSMs identified by the abstraction heuristics.
Persistent signals are the sequential signals left after abstraction.
Temporary signals are all other signals.

The rationale behind this is that since after abstraction, each transaction is compressed into one abstract time step, all sequential signals that are used within only a single transaction become combinational after abstraction. Any signal that is sequential after abstraction must persist between transaction. The definition of transient signals is precisely the definition of transaction-processing FSMs defining transactions in the abstraction process. Therefore, this process produces a signal classification.

Automatically Creating A Test Plan Based On A Signal Classification

A test plan is a set of coverage points that must be exercised in a design. A coverage point can be either:
a Boolean expression over all the signals in a design that must be true, or
a range of values for a signal, for example, a 4-bit wide signal that can have values in the range 0-15.

Coverage points are typically defined in terms of a simulation model, which comprises a device plus a test case and other models, that may be used to compute the results of the simulation. A coverage point is considered covered during simulation if 1) it becomes true at some point during simulation if it is a Boolean expression, or 2) the signal takes on a value from the specified range at some point during simulation.

In accordance with the present invention, a test plan can be automatically generated by identifying the architecturally visible state in the design and then creating coverage for signals in the design. In some embodiments the architecturally-visible state can be identified by classifying all signals in the design as either transient, persistent or temporary, as discussed above using transaction-based abstraction analysis.

Figure 10:
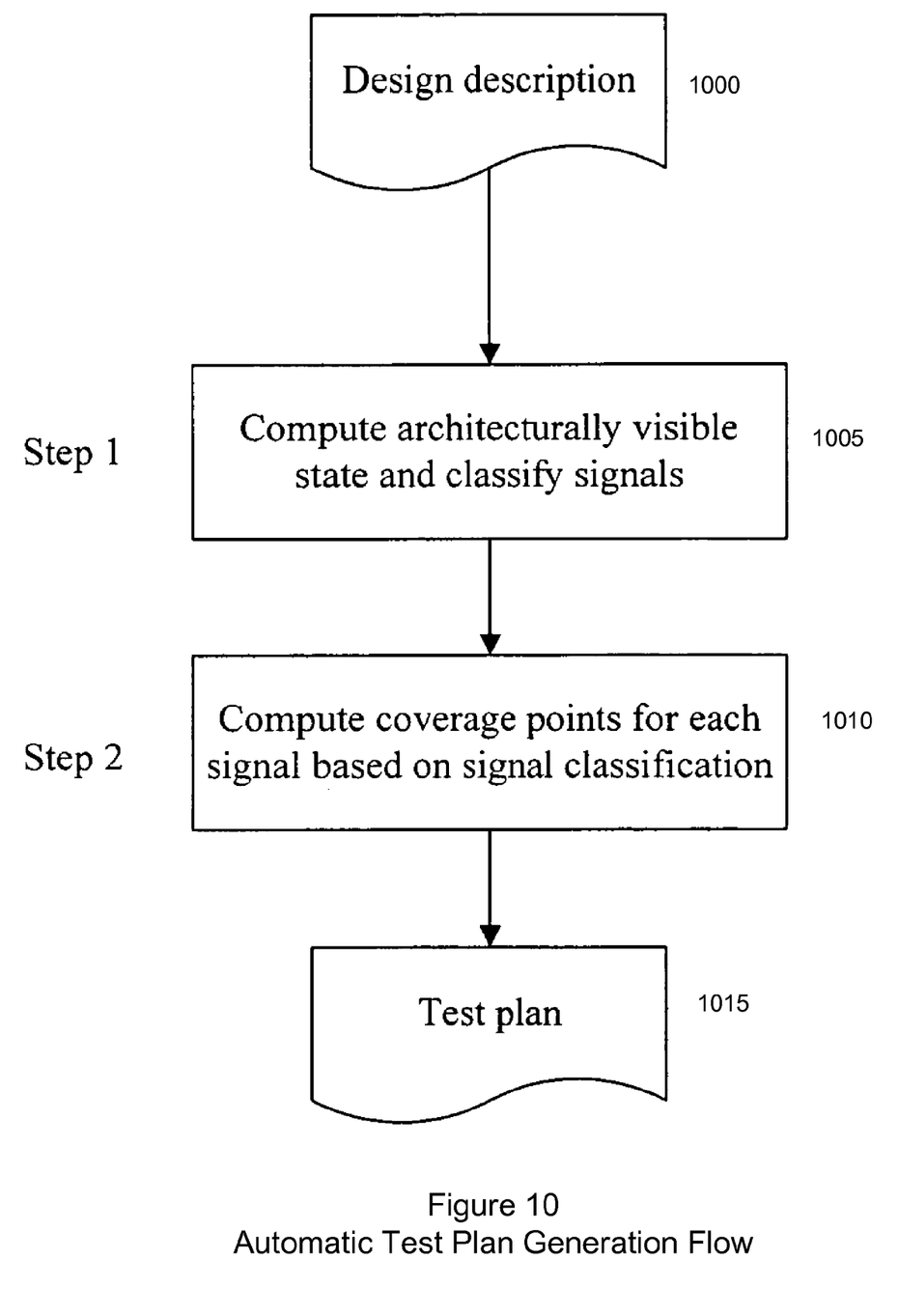
FIG. 10 illustrates a flow for creating a test plan automatically from a design description according to certain embodiments of the invention.

FIG. 10 illustrates a flow for creating a test plan automatically from a design description according to certain embodiments of the invention. As shown in FIG. 10, the input to the test plan generation process consists of a design description, labeled 1000, which, in some embodiments comprises a description written in a hardware description language (HDL) such as Verilog. The first step, as shown in FIG. 10 at 1005, is to determine the architecturally visible state and to classify the signals. The second step, labeled 1010, is then to coverage points for the classified signals based on the information computed in the first step using techniques described previously herein and output this as a test plan, as indicated at 1015.

Signals are classified as transient, temporary, or persistent, where persistent signals can be considered the architecturally visible state and transient and temporary signals are the non-architecturally visible. The testing strategies for architecturally visible and non-architecturally visible state are different. Therefore, the coverage points for different classifications are different. For each of these classifications, coverage points are generated as follows:

Transient Signals

Each transient signal represents a transaction-processing finite state machine (FSM). A finite state machine consists of a set of states and transitions between states. Transitions may be conditional, specified by a Boolean condition. Transaction-processing FSMs implement the protocol that defines a transaction. It is necessary to verify all possible timings of a protocol. Since the FSM must handle all possible cases, to completely test the protocol requires exercising every transition in the FSM. Let (u, g, v) be a transition in a transaction-processing FSM where u and v are states and g is a Boolean expression over all signals be defined as if, at time t, the value of the FSM signal at time t−1 was u, and the value at time t is v, and g is true at time t, then this transition has been taken at time t. Therefore the coverage point is the expression:

$$s(t-1)==u\&\&s(t)==v\&\&g(t)$$

There will be one coverage point for each transition in the FSM.

Temporary Signals

In a typical device, temporary signals will comprise the majority of signals. These primarily are data signals, not control signals. Therefore, collectively, they represent a large number of bits. Normally, with data, it is desirable to cover a large number of values. Temporary signals are normally defined as a set of assignments, each of which is enabled under different conditions defined by Boolean expressions over all signals. Assume that a temporary signal has a set of assignments with an associated condition, represented as ($e_i$, $g_i$) where $e_i$ is an assignment expression and $g_i$ is the Boolean guard expression. The set of coverage points for a temporary signal is the set of guards, $g_i$ plus the range of all possible values for the signal based on its defined width (number of bits).

Persistent Signals

Persistent signals may be data or control. For cases in which persistent signals are data values, they can generate the same coverage points as temporary signals. If not, it is desirable to cover as many different values as possible since these potentially represent different states. Also, if they do represent state, persistent signals often interact with other persistent signals. Therefore, the coverage points for persistent state to be measured are the ranges of values of persistent signal values.

As a refinement of this, the set of persistent signals can be partitioned such that persistent signals that are not transitively dependent on each other are put in different partitions. Coverage points for persistent state are then created as ranges of combinations of values for signals within a partition.

The set of coverage points generated by this analysis forms a comprehensive test plan for a simulated device. This is beneficial because it is automatically generated, relieving the user from the tedious chore of creating a test plan manually.

It will be appreciated by those skilled in the art, given the teachings herein, that the present invention includes within its scope transaction-based methods for verification of hardware systems which include: automatic generation of test benches; the use of a signal analyzer technique or tool to execute simulation of one or more transactions and determine whether signals are transient, temporary, persistent etc., including the use of the information thus determined in helping to define the next steps to be taken for verification; coverage point classification; and a two-step methodology for verification, wherein the transaction based analysis is done as step one on the first version of the design to generate a relatively small number of test vectors, and a second pass only replays the test vectors thus generated. In comparison, traditional simulation has millions of test vectors, and replays all test vectors as it has no way of knowing which test vectors hit which coverage points.

Although the present invention has been particularly described with reference to embodiments thereof, it should be readily apparent to those of ordinary skill in the art that various changes, modifications, substitutes and deletions are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of inventive elements illustrated and described in the above figures. It is intended that the scope of the appended claims include such changes and modifications.

What is claimed is:

1. A method of automatically creating a test plan for a design, the method comprising:
   receiving a description of the design;
   determining an architecturally visible state in the design, wherein determining an architecturally visible state includes classifying each signal in the design as one of transient, persistent, and temporary, wherein transient signals are signals corresponding to transaction-processing finite state machines identified by abstraction heuristics, persistent signals are sequential signals left after abstraction, and temporary signals are any signals that are not transient signals or persistent signals;
   computing by a computer coverage points for each signal based on its classification; and
   outputting a set of coverage points based on the computing, the set of coverage points providing a comprehensive test plan for a simulation of the design.

2. The method of claim 1, wherein the description of the design is a hardware design language (HDL) file.

3. The method of claim 2, wherein a coverage point is covered during simulation when:
   the coverage point becomes true at some point during simulation; or the signal takes on a value from the range of values at some point during simulation.

4. The method of claim 1, wherein each coverage point is one of:
   a Boolean expression over all signals in the design that must be true; and
   a range of values for a signal.

5. A method of automatically creating a test plan for a design, the method comprising:
   receiving a description of the design;
   determining an architecturally visible state in the design, wherein determining an architecturally visible state includes classifying each signal in the design as one of transient, persistent, and temporary, wherein transient signals detect when a transaction starts, control processing of the transaction, and indicate completion of the transaction, persistent signals are set in one transaction and read in another transaction, and temporary signals are used only within a single transaction;
   computing by a computer coverage points for each signal based on its classification; and
   outputting a set of coverage points based on the computing, the set of coverage points providing a comprehensive test plan for a simulation of the design.

6. The method of claim 5, wherein computing coverage points for a transient signal is expressed by:

$$s(t-1)==u\&\&s(t)==v\&\&g(t),$$

wherein t is a time, s is a state, u is a current state, v is a next state, and g is a condition that must be true for a state transition to occur.

7. The method of claim 5, wherein a temporary signal has a set of assignments with an associated condition, represented as ($e_i$,$g_i$), where $e_i$ is an assignment expression and $g_i$ is a Boolean guard expression, and wherein computing coverage points for a temporary signal is a set of Boolean guard expressions plus a range of all possible values for the temporary signal based on its defined width.

8. The method of claim 7, wherein the defined width is a number of bits.

9. The method of claim 5, wherein computing coverage points for a persistent signal includes measuring ranges of values of the persistent signal.

10. The method of claim 9, further including partitioning a set of persistent signals, wherein persistent signals that are not transitively dependent on each other are placed in a separate partition, wherein computing coverage points for a persistent signal includes determining ranges of combinations of values for signals within the separate partition.

11. The method of claim 5, wherein the description of the design is a hardware design language (HDL) file.

12. The method of claim 5, wherein each coverage point is one of:
 a Boolean expression over all signals in the design that must be true; and
 a range of values for a signal.

13. The method of claim 5, wherein a coverage point is covered during simulation when:
 the coverage point becomes true at some point during simulation; or
 the signal takes on a value from a range of values at some point during simulation.

* * * * *

UNITED STATES PATENT AND TRADEMARK OFFICE
CERTIFICATE OF CORRECTION

| | | |
|---|---|---|
| PATENT NO. | : 8,020,123 B2 | Page 1 of 1 |
| APPLICATION NO. | : 12/099723 | |
| DATED | : September 13, 2011 | |
| INVENTOR(S) | : Wilson | |

It is certified that error appears in the above-identified patent and that said Letters Patent is hereby corrected as shown below:

In the Claims

Column 12
Claim 1, Line 12, insert --said-- after "wherein".
Claim 3, Line 30, amend "the" (second occurrence) to --a--.
Claim 5, Line 41, insert --said-- after "wherein".
Claim 6, Line 54, insert --said-- after "wherein".
Claim 7, Line 64, insert --said-- after "wherein".

Column 13
Claim 9, Line 3, insert --said-- after "wherein".
Claim 10, Line 9, insert --said-- after "wherein".

Signed and Sealed this
Eleventh Day of February, 2014

Michelle K. Lee
*Deputy Director of the United States Patent and Trademark Office*